(12) United States Patent
Chen et al.

(10) Patent No.: US 9,997,447 B1
(45) Date of Patent: Jun. 12, 2018

(54) SEMICONDUCTOR DEVICES

(71) Applicant: Advanced Semiconductor Engineering, Inc., Kaohsiung (TW)

(72) Inventors: Chien-Hua Chen, Kaohsiung (TW); Hung-Yi Lin, Kaohsiung (TW); Sheng-Chi Hsieh, Kaohsiung (TW)

(73) Assignee: ADVANCED SSEMICONDUCTOR ENGINEERING, INC., Kaohsiung (TW)

( * ) Notice: Subject to any disclaimer, the term of this patent is extended or adjusted under 35 U.S.C. 154(b) by 0 days. days.

(21) Appl. No.: 15/618,083

(22) Filed: Jun. 8, 2017

(51) Int. Cl.
*H01L 23/48* (2006.01)
*H01L 23/498* (2006.01)
*H01L 23/64* (2006.01)
*H01L 23/00* (2006.01)

(52) U.S. Cl.
CPC .. *H01L 23/49838* (2013.01); *H01L 23/49816* (2013.01); *H01L 23/642* (2013.01); *H01L 23/645* (2013.01); *H01L 24/24* (2013.01); *H01L 2224/24195* (2013.01)

(58) Field of Classification Search
CPC ... H01L 21/4853; H01L 21/565; H01L 21/78; H01L 23/49838; H01L 23/49816; H01L 23/5223; H01L 23/642; H01L 23/645; H01L 24/19; H01L 24/24; H01L 24/96; H01L 24/97; H01L 25/50; H01L 28/60; H01L 28/40

USPC ................. 257/532, 774; 438/107
See application file for complete search history.

(56) References Cited

U.S. PATENT DOCUMENTS

| | | | |
|---|---|---|---|
| 9,496,213 B2 | 11/2016 | Kidwell et al. | |
| 9,543,373 B2 | 1/2017 | Liang et al. | |
| 2005/0023639 A1* | 2/2005 | Yeh | H01L 27/08 257/531 |
| 2014/0225222 A1* | 8/2014 | Yu | H01L 28/60 257/532 |
| 2016/0042846 A1* | 2/2016 | Wang | H01F 1/0302 336/200 |

* cited by examiner

*Primary Examiner* — Brook Kebede
(74) *Attorney, Agent, or Firm* — Foley & Lardner LLP; Cliff Z. Liu

(57) ABSTRACT

A semiconductor device package includes a carrier, a first insulation layer, a capacitor element, a plurality of interconnection structures, a plurality of substantially parallel top-side metal bars, and a plurality of substantially parallel bottom-side metal bars. The first insulation layer is on the carrier and has a first surface and a second surface adjacent to the carrier and opposite to the first surface, the first insulation layer defining a plurality of through holes. The capacitor element is in the first insulation layer, the capacitor element including a top electrode and a bottom electrode. The plurality of interconnection structures are within the through holes and formed as conductive through holes. The plurality of substantially parallel top-side metal bars are on the first surface of the first insulation layer. The plurality of substantially parallel bottom-side metal bars are on the second surface of the first insulation layer.

17 Claims, 12 Drawing Sheets

| | Inductor Condition | | Metal Thk. (um) | Inductance [NH] | Quality Factor | | |
|---|---|---|---|---|---|---|---|
| | Min. L/S (um) | Dimension (um³) | | | 0.9GHz | 2.4GHz | Max. |
| 2D IPD IND | 50/20 | 800x800 | 10 | 3.4 | 47 | 62 | 64 |
| | | | 20 | 3.3 | 48 | 69 | 71 |
| | | | 30 | 3.1 | 52 | 73 | 76 |
| | | | 40 | 3 | 55 | 77 | 80 |
| | | | 50 | 2.9 | 56 | 80 | 82 |
| | | | 60 | 2.9 | 58 | 85 | 86 |
| U-Sharp IND | 50/20 | 800x800 | 10 | 2.9 | 58 | 81 | 83 |

| Metal: Copper | 0.5GHz | 1GHz | 2GHz | 3GHz | 5GHz |
|---|---|---|---|---|---|
| Skin depth (um) | 2.9 | 2.9 | 2.9 | 2.9 | 0.9 |

FIG. 9

SEMICONDUCTOR DEVICES

BACKGROUND

1. Technical Field

The present disclosure relates to a semiconductor device. In particular, the present disclosure relates to a semiconductor device including integrated passive components.

2. Description of the Related Art

Quality factor (or Q-factor) of an inductor may depend on thickness and coil area of the inductor. A two-dimensional (2D) inductor formed or disposed on a carrier may not have greater thickness but the coil area thereof can be increased to achieve a relatively high Q-factor. However, the oversized coil area may take a huge space on the carrier that may adversely affect integration and miniaturization of the product. A three-dimensional (3D) inductor, which has a taller through glass via/through silicon via (TGV/TSV) or copper (Cu) pillar, may have a relatively higher Q-factor. However, it may be challenging to manufacture tall Cu pillars as well as TGV/TSV with high aspect ratio (e.g., the ratio of height to width), by, for example, a plating technique. Moreover, the majority of a Cu pillar or TGV/TSV is redundant due to the tendency of an alternating current (AC) to become distributed within a conductor such that the current density is largest near the surface of the conductor, and decreases with greater depths in the conductor (e.g., a Skin effect).

SUMMARY

In some embodiments, a semiconductor device package includes a carrier, a first insulation layer, a capacitor element, a plurality of interconnection structures, a plurality of substantially parallel top-side metal bars, and a plurality of substantially parallel bottom-side metal bars. The first insulation layer is on the carrier and has a first surface and a second surface adjacent to the carrier and opposite to the first surface, the first insulation layer defining a plurality of through holes. The capacitor element is in the first insulation layer, the capacitor element including a top electrode and a bottom electrode. The plurality of interconnection structures are within the through holes and formed as conductive through holes. The plurality of substantially parallel top-side metal bars are on the first surface of the first insulation layer. The plurality of substantially parallel bottom-side metal bars are on the second surface of the first insulation layer. Each of the conductive through holes couples one of the plurality of top-side metal bars to one of the plurality of bottom-side metal bars, and a first one of the plurality of bottom-side metal bars is electrically connected to the top electrode of the capacitor element and a second one of the plurality of bottom-side metal bars is electrically connected to the bottom electrode of the capacitor element.

In some embodiments, a semiconductor device includes a carrier, a first insulation layer, a capacitor element, a die, and a conductive layer. The first insulation layer is on the carrier and has a first surface and a second surface adjacent to the carrier and opposite to the first surface, the first insulation layer defining a plurality of through holes, each of the through holes having a first side wall, and defining a cavity having a second side wall. The capacitor element is in the first insulation layer, the capacitor element including a top electrode and a bottom electrode. The die is disposed in the cavity of the first insulation layer. The conductive layer includes a plurality of interconnection structures respectively disposed on the first side wall and the second side wall and has a plurality of top continuous portions and a plurality of bottom continuous portions. The interconnection structures, the top continuous portions and the bottom continuous portions of the conductive layer form an inductor element, and a first one of the bottom continuous portions of the conductive layer is electrically connected to the top electrode of the capacitor element and a second one of the bottom continuous portions of the conductive layer is electrically connected to the bottom electrode of the capacitor element.

In some embodiments, a semiconductor device includes a carrier, a spiral insulation layer and a spiral conductive layer. The spiral insulation layer is on the carrier. The spiral conductive layer is on the carrier and surrounds the spiral insulation layer.

BRIEF DESCRIPTION OF THE DRAWINGS

FIG. 9 illustrates simulation results in accordance with some embodiments of the present disclosure.

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

Described in this disclosure are techniques for providing devices with reduced package sizes. The techniques are cost effective, and are compatible with forming two-and-a-half dimensional (2.5D) and three-dimensional (3D) integrated circuit (IC) packages.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Figure 1:
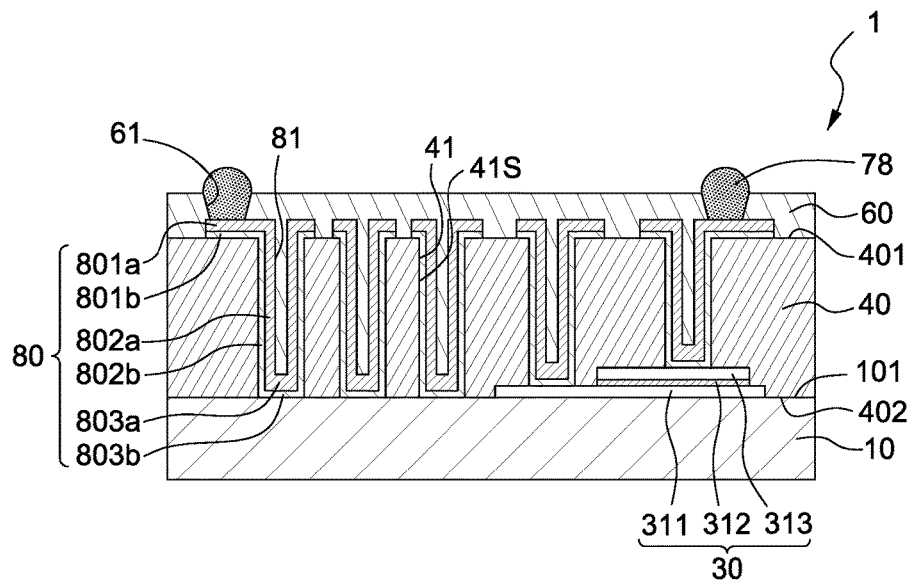
FIG. 1 is a cross-sectional view of a semiconductor device in accordance with some embodiments of the present disclosure.

FIG. 1 is a cross-sectional view of a semiconductor device 1 in accordance with some embodiments of the present disclosure. The semiconductor device 1 includes a carrier 10, an insulation layer (e.g., a first insulation layer) 40, patterned conductive layers 80, conductive connects 78 and an insulation layer (e.g., a second insulation layer) 60. The patterned conductive layer 80 includes at least one metal bar (e.g., a first metal bar) 801*a*, at least one metal bar (e.g., a second metal bar) 801*b*, interconnection structure (e.g., first interconnection structure) 802*a*, interconnection structure (e.g., second interconnection structure) 802*b*, at least one metal bar (e.g., a third metal bar) 803*a* and at least one metal bar (e.g., a fourth metal bar) 803*b*. Metal bars 801*a* and 801*b* can also be referred to as substantially parallel top-side metal bars and metal bars 803*a* and 803*b* can also be referred to as substantially parallel bottom-side metal bars.

In one or more embodiments, the carrier 10 includes glass, silicon, silicon dioxide ($SiO_2$), or a combination thereof. The carrier 10 has a top surface 101. In one or more embodiments, a thickness of the carrier 10 is in a range of about 100 micrometers (μm) to about 300 In some embodiments, the carrier 10 is a glass carrier and a surface roughness of the glass carrier is less than about 1 μm due to the manufacturing process of the illustrated embodiments, such as about 900 nanometers (nm) or less, or about 800 nm or less in terms of root-mean-square surface roughness.

In one or more embodiments, the carrier 10 may include one or more active components (e.g., ICs) embedded in the carrier 10, and/or one or more active components disposed on the carrier 10. In one or more embodiments, the carrier 10 may include one or more passive components (e.g., a capacitor or capacitor element 30 as shown in FIG. 1) disposed on the carrier 10. The capacitor 30 includes patterned conductive layers 311 and 313 (e.g., a bottom electrode 311 and a top electrode 313), together with an insulating layer 312. In some embodiments, a first one of the plurality of bottom-side metal bars 803*a* and 803*b* is electrically connected to the top electrode 313 of the capacitor 30 and a second one of the plurality of bottom-side metal bars 803*a* and 803*b* is electrically connected to the bottom electrode 311 of the capacitor 30.

The insulation layer 40 is disposed on the surface 101 of the carrier 10. The insulation layer 40 has a top surface 401 and a surface (e.g., bottom surface) 402 adjacent to the carrier 10 and opposite to the top surface 401. In some embodiments, the insulation layer 40 includes a suitable insulating material. For example, the insulation layer 40 may include, or may be formed from, an exposure-type negative photoresist. In one or more embodiments, a thickness of the insulation layer 40 is in a range of about 60 μm to about 180 μm.

The metal bars 801*a* and 801*b* are disposed on the surface 401 of the insulation layer 40. The metal bar 801*a* is disposed on the metal bar 801*b*. The metal bars 803*a* and 803*b* are disposed on the surface 101 of the carrier 10. The metal bar 803*a* is disposed on the metal bar 803*b*. The interconnection structures 802*a* and 802*b* penetrate the insulation layer 40 and connect the metal bars 801*a* and 801*b* to the metal bars 803*a* and 803*b*. In some embodiments, the metal bar 801*b*, interconnection structure 802*b* and metal bar 803*b* may include, for example, titanium-copper (Ti—Cu) alloy or another suitable metal or metal alloy, or a combination thereof. The metal bar 801*b*, interconnection structure 802*b* and metal bar 803*b* may be a seed layer to allow formation of the metal bar 801*a*, interconnection structure 802*a* and metal bar 803*a*. The metal bar 801*a*, interconnection structure 802*a* and metal bar 803*a* may be a plating layer. The metal bars 801*a* and 801*b* are electrically connected to the interconnection structures 802*a* and 802*b*, respectively.

The semiconductor device 1 may include a plurality of metal bars 801*a*, a plurality of metal bars 801*b*, a plurality of metal bars 803*a* and a plurality of metal bars 803*b*. The plurality of metal bars 801*a* are substantially parallel to each other, for example, along one or more extending directions along a plane of the surface 101 of the carrier 10. The plurality of metal bars 801*b* are substantially parallel to each other, for example, along one or more extending directions along a plane of the surface 101 of the carrier 10. The plurality of metal bars 803*a* are substantially parallel to each other, for example, along one or more extending directions along a plane of the surface 101 of the carrier 10. The plurality of metal bars 803*b* are substantially parallel to each other, for example, along one or more extending directions along a plane of the surface 101 of the carrier 10. The metal bars 803*a* and 803*b* on the carrier 10 may not be parallel to the metal bars 801*a* and 801*b*. The metal bars 803*a* and 803*b* on the carrier 10 are electrically connected to the interconnection structures 802*a* and 802*b*, respectively.

In some embodiments, the metal bar 801*a*, interconnection structure 802*a* and metal bar 803*a* may include, for example, copper (Cu), or other metal, or a metal alloy, or other conductive material. In some embodiments, the material of the seed layer is different from the material of the plating layer.

In some embodiments, the metal bars 801*a* and 801*b*, the interconnection structures 802*a* and 802*b* and the metal bars 803*a* and 803*b* function as an inductor. In some embodiments, the interconnection structures 802*a* and 802*b* may function as a shielding element. Compared with a 2D integrated passive device (IPD) inductor, the patterned conductive layer 80 can provide substantially the same electrical conductivity, Q factor and inductance (e.g., the patterned conductive layer 80 is a 3D inductor structure for a U-sharp inductor).

The insulation layer 60 is disposed on the surface 401 of the insulation layer 40. The insulation layer 60 covers the metal bars 801*a* and 801*b*, the interconnection structure 802*a*, the metal bar 803*a* and the surface 401 of the insulation layer 40. The insulation layer 60 is extended into the insulation layer 40. The interconnection structure 802*a* surrounds extended portions of the insulation layer 60. In some embodiments, the insulation layer 40 includes a first insulation material and the insulation layer 60 includes a second insulation material different from the first insulation material. In some embodiments, the material of the insulation layer 60 may be an exposure-type negative photoresist; however, other suitable materials may be additionally or alternatively used. The conductive connects 78 are filled into vias 61 to cover the metal bars 801*a*. The conductive connects 78 may be solder balls. In some embodiments, a plurality of through holes (e.g., vias) 41 are formed within the first insulation layer 40, and each of the through holes 41 has a side wall (e.g., a first side wall) 41*s*.

Figure 2:
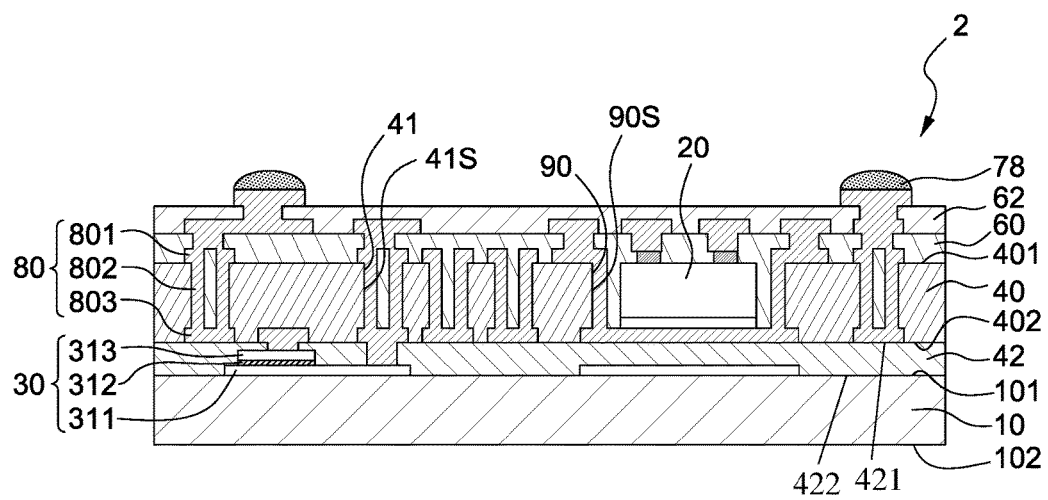
FIG. 2 is a cross-sectional view of a semiconductor device package in accordance with some embodiments of the present disclosure.

FIG. 2 is a cross-sectional view of a semiconductor device package 2 in accordance with some embodiments of the present disclosure. The semiconductor device package 2 is similar to the semiconductor device 1 of FIG. 1, and same-numbered components are not described again with respect to FIG. 2. The semiconductor device package 2 is similar to the semiconductor device 1 of FIG. 1, except that an insulation layer 42 is disposed between the insulation layer 40 and the carrier 10. The semiconductor device package 2 includes a carrier 10, a semiconductor die 20, an insulation layer 40, the insulation layer 42, patterned conductive layers 80, conductive connects 78, an insulation layer 60 and an insulation layer 62. The patterned conductive layer 80 includes at least one metal bar 801, interconnection structure 802 and at least one metal bar 803.

The insulation layer 42 is disposed on the surface 101 of the carrier 10. The insulation layer 42 has a top surface 421 and a surface 422 adjacent to the carrier 10 and opposite to the top surface 421. In some embodiments, the material of the insulation layers 42 and 60 may be an exposure-type negative photoresist; however, other suitable materials may be additionally or alternatively used. The insulation layer 40 may include, or may be formed from, an exposure-type negative photoresist. In some embodiments, the insulation layer 40 includes a first insulation material and the insulation layers 42 and 60 include a second insulation material different from the first insulation material.

The metal bar 803 is disposed on the surface 421 of the insulation layer 42. The metal bar 801 is disposed on the surface 401 of the insulation layer 40. The interconnection structure 802 penetrates the insulation layer 40 and connects the metal bars 801 to the metal bars 803. In some embodiments, the metal bar 801, interconnection structure 802 and metal bar 803 may include, for example, Cu, or other metal, or a metal alloy, or other conductive material. The metal bar 801, interconnection structure 802 and metal bar 803 may include a seed layer to allow plating during the formation of the metal bar 801, interconnection structure 802 and metal bar 803. The metal bars 801 may also be referred to as top continuous portions and the metal bars 803 may also be referred to as bottom continuous portions.

The insulation layer 60 covers the surface 401 of the insulation layer 40, the semiconductor die 20 and the metal bars 801. A portion of the insulation layer 60 is surrounded by the metal bar 801 and interconnection structure 802. The semiconductor die 20 is attached to the metal bar 803 through a conductive adhesive layer. The semiconductor die 20 is surrounded by the metal bar 801 and interconnection structure 802. The metal bar 801 and interconnection structure 802 may function as a shielding element for shielding the semiconductor die 20. The insulation layer 62 may be a solder mask layer. In some embodiments, the material of the insulation layer 62 may be an epoxy resin, exposure-type negative photoresist or other insulating materials used additionally or alternatively. The conductive connects 78 are connected to the metal bar 801 through a conductive pad. The conductive connects 78 may be solder balls.

In some embodiments, a cavity 90 is formed in the insulation layer 40 and the cavity 90 has a side wall (e.g., a second side wall) 90s. In some embodiments, the die 20 is disposed in the cavity 90 of the insulation layer 40. In some embodiments, the conductive layer 80 including the interconnection structures 802 are disposed on a first side wall 41s and the second side wall 90s of the insulation layer 40. In some embodiments, the conductive layer 80 includes top continuous portions or metal bars 801 and bottom continuous portions or metal bars 803.

Figure 3A:
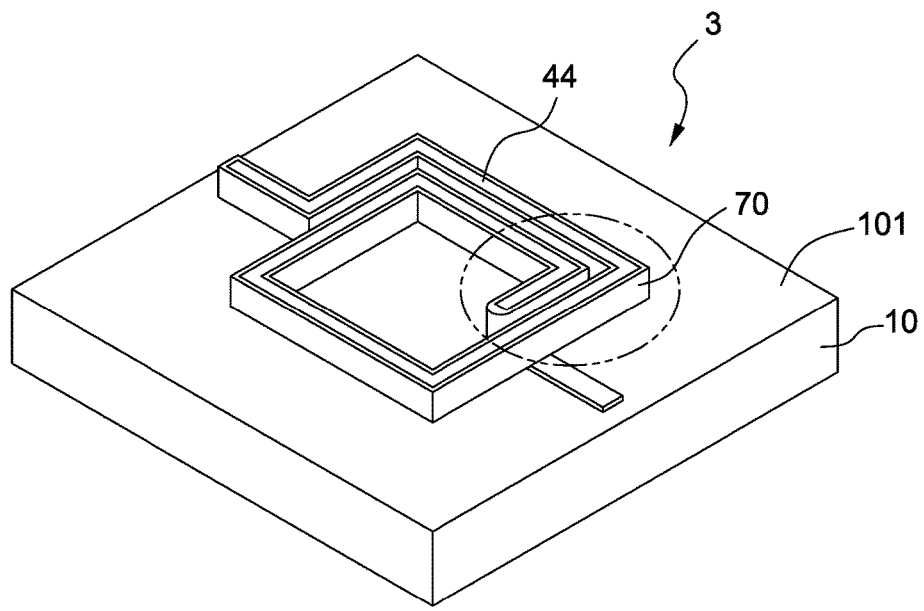
FIG. 3A and FIG. 3B are perspective views of a semiconductor device in accordance with some embodiments of the present disclosure.
Figure 3B:
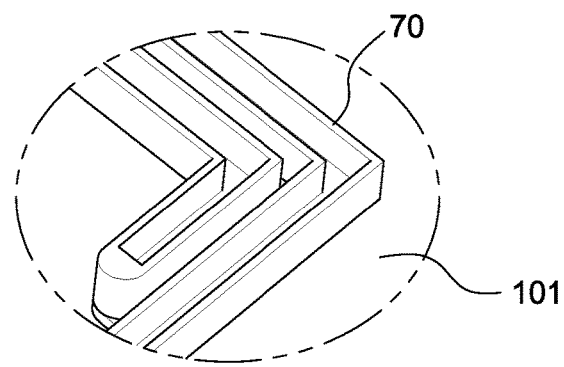

FIG. 3A and FIG. 3B are perspective views of a semiconductor device 3 in accordance with some embodiments of the present disclosure. In FIG. 3A, the semiconductor device 3 includes a carrier 10, a spiral insulation layer 44 on the carrier 10 and a spiral conductive layer 70 on the carrier 10 and surrounding the spiral insulation layer 44. In one or more embodiments, the carrier 10 includes glass, silicon, $SiO_2$, or a combination thereof. The material of the spiral insulation layer 44 may include a suitable insulating material. In one or more embodiments, the material of the spiral insulation layer 44 may be a polypropylene resin; however, other suitable materials may be additionally or alternatively used. The material of the spiral conductive layer 70 may include, for example, Cu, or other metal, or a metal alloy, or other conductive material. In one or more embodiments, the semiconductor device 3 may be a U-sharp inductor. In some embodiments, the thickness of the spiral conductive layer 70 is less than about 10 μm. In some embodiments, the semiconductor device 3 may include a patterned insulation layer surrounding the spiral conductive layer 70. Compared with the comparable 2D inductor, the 2D inductor having the hollow continuous spiral conductive layer 70 can provide substantially the same electrical conductivity, Q factor and inductance. In FIG. 3B, the partial magnification of the hollow continuous spiral conductive layer 70 is not filled with an insulation layer. In some embodiments, the thickness of the spiral conductive layer 70 is no greater than or less than about 10 μm, such as about 900 nm or less, or about 800 nm or less.

Figure 4A:
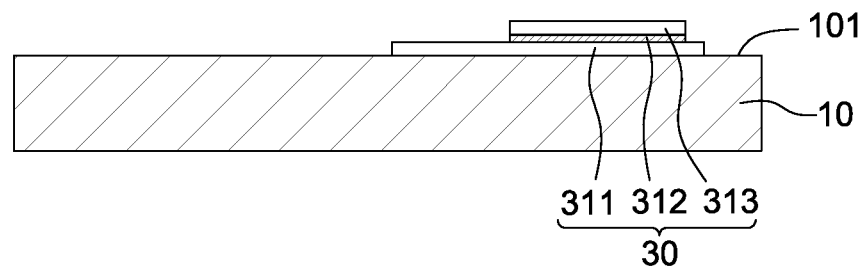
FIG. 4A, FIG. 4B, FIG. 4C, FIG. 4D, and FIG. 4E illustrate a method of manufacturing the semiconductor device of FIG. 1 in accordance with some embodiments of the present disclosure.

FIG. 4A, FIG. 4B, FIG. 4C, FIG. 4D, and FIG. 4E illustrate a method of manufacturing the semiconductor device 1 of FIG. 1 in accordance with some embodiments of the present disclosure. Referring to FIG. 4A, a carrier 10 is provided. The carrier 10 has a top surface 101. The carrier 10 includes glass, silicon, $SiO_2$, or a combination thereof. A patterned conductive layer 311, an insulating layer 312 and a patterned conductive layer 313 are disposed on the surface 101 of the carrier 10. The patterned conductive layers 311 and 313, together with the insulating layer 312, form the capacitor 30.

Figure 4B:
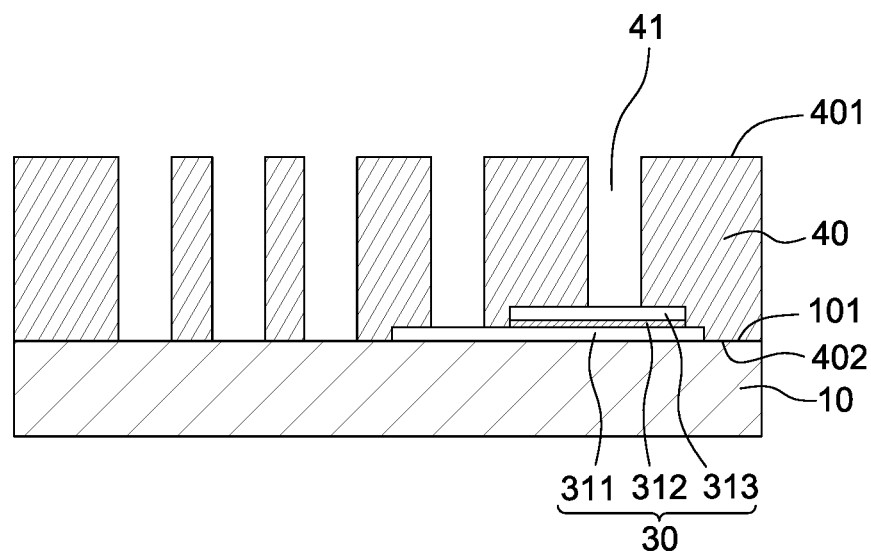

Referring to FIG. 4B, a patterned insulation layer 40 is disposed on the surface 101 of the carrier 10. The patterned insulation layer 40 covers a portion of the capacitor 30. The patterned insulation layer 40 has a top surface 401. In some embodiments, the insulation layer 40 includes a suitable insulating material. For example, the insulation layer 40 may include, or may be formed from, an exposure-type negative photoresist. In one or more embodiments, a thickness of the insulation layer 40 is in a range of about 60 μm to about 180 The patterned insulation layer 40 includes vias 41. The diameter of the vias 41 is less than about 20 μm.

Figure 4C:
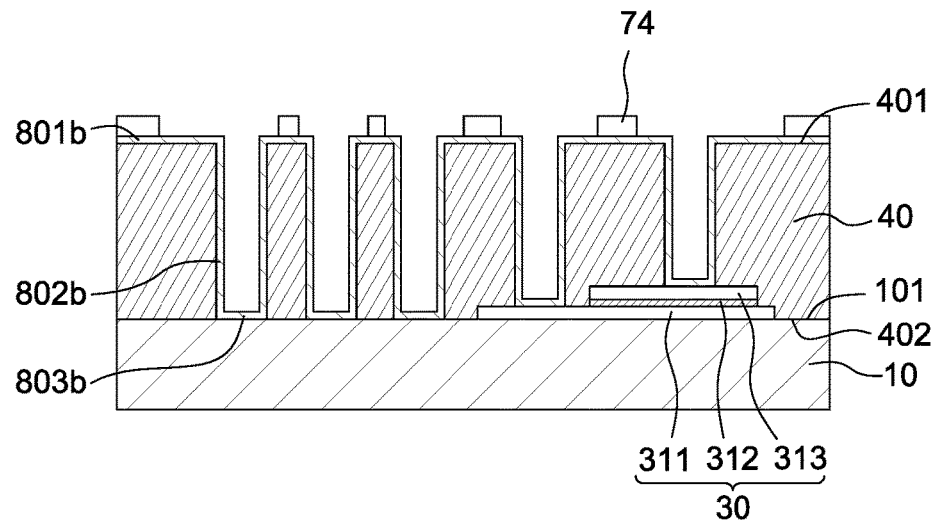

Referring to FIG. 4C, metal bars 803b are disposed on the bottom surface of the vias 41. Interconnection structures 802b are disposed on the sidewall of the vias 41. Metal bars 801b are disposed on the surface 401 of the insulation layer 40. A patterned photoresist layer 74 is disposed on a portion of the metal bars 801b. The metal bars 803b, interconnection structures 802b and metal bars 801b may be a seed layer, and may integrally formed with one another. In some embodiments, the metal bar 801b, interconnection structure 802b and metal bar 803b may include, for example, Ti—Cu alloy or another suitable metal or metal alloy, or a combination thereof.

Figure 4D:
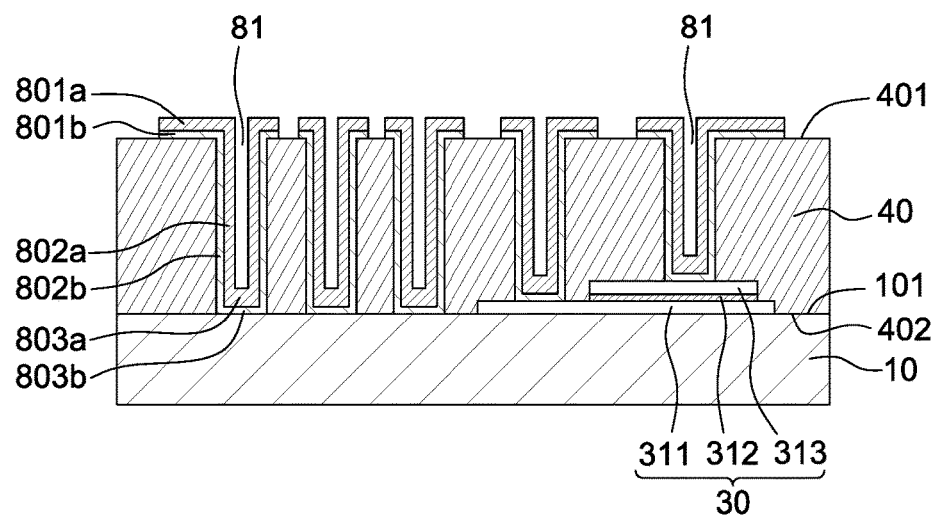

Referring to FIG. 4D, the metal bars 801a, interconnection structures 802a and metal bars 803a are formed by plating, and may be integrally formed with one another. In some embodiments, the metal bar 801a, interconnection structure 802a and metal bar 803a may include, for example, Cu, or other metal, or a metal alloy, or other conductive material. After plating, the patterned conductive layers 80 include the metal bars 801a and 801b, interconnection structures 802a and 802b and metal bars 803a and 803b. The patterned conductive layers 80 also include vias 81. The patterned photoresist layer 74 is removed by etching.

Figure 4E:
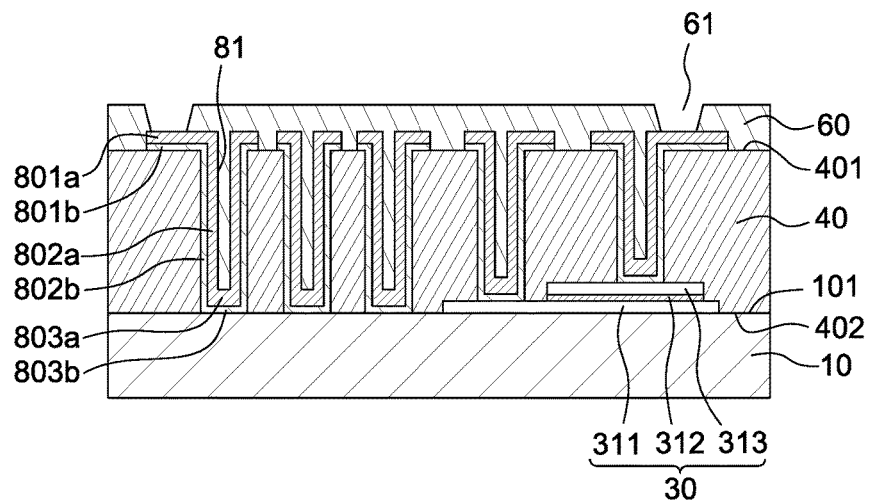

Referring to FIG. 4E, the insulation layer 60 is formed or disposed on the surface 401 of the insulation layer 40. The insulation layer 60 covers the metal bars 801a and 801b, the interconnection structure 802a, the metal bar 803a and the surface 401 of the insulation layer 40. The insulation layer 60 is extended into the insulation layer 40 and fills the vias 81. In some embodiments, the interconnection structure 802a surrounds extended portions of the insulation layer 60.

In some embodiments, the insulation layer 40 includes a first insulation material and the insulation layer 60 includes a second insulation material different from the first insulation material. In some embodiments, the material of the insulation layer 60 may be an exposure-type negative photoresist; however, other suitable materials may be additionally or alternatively used. Next, conductive connects 78 are filled into the vias 61 to cover the metal bars 801a to obtain the semiconductor device 1 of FIG. 1. The conductive connects 78 may be solder balls.

Figure 5A:
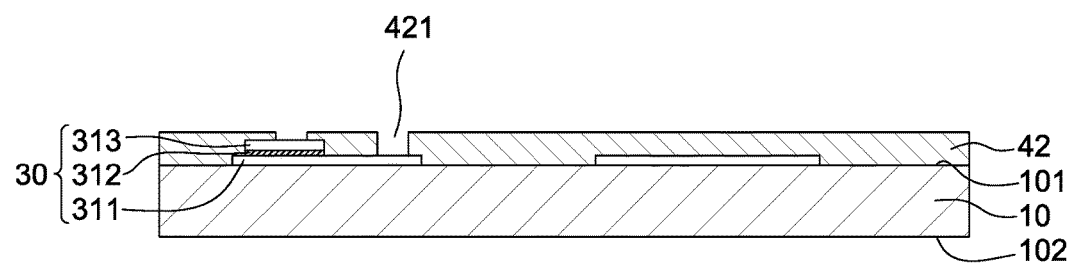
FIG. 5A, FIG. 5B, FIG. 5C, FIG. 5D, and FIG. 5E illustrate a method of manufacturing the semiconductor device package of FIG. 2 in accordance with some embodiments of the present disclosure.

FIG. 5A, FIG. 5B, FIG. 5C, FIG. 5D, and FIG. 5E illustrate a method of manufacturing the semiconductor device package 2 of FIG. 2 in accordance with some embodiments of the present disclosure. Referring to FIG. 5A, a carrier 10 is provided. The carrier 10 has a top surface 101. The carrier 10 includes glass, silicon, $SiO_2$, or a combination thereof. A patterned conductive layer 311, an insulating layer 312 and a patterned conductive layer 313 are disposed on the surface 101 of the carrier 10. The patterned conductive layers 311 and 313, together with the insulating layer 312, form the capacitor 30. An insulation layer 42 is disposed on the carrier 10 and covers the capacitor 30. The insulation layer 42 includes vias 421. In some embodiments, the material of the insulation layer 42 may be an exposure-type negative photoresist; however, other suitable materials may be additionally or alternatively used.

Figure 5B:
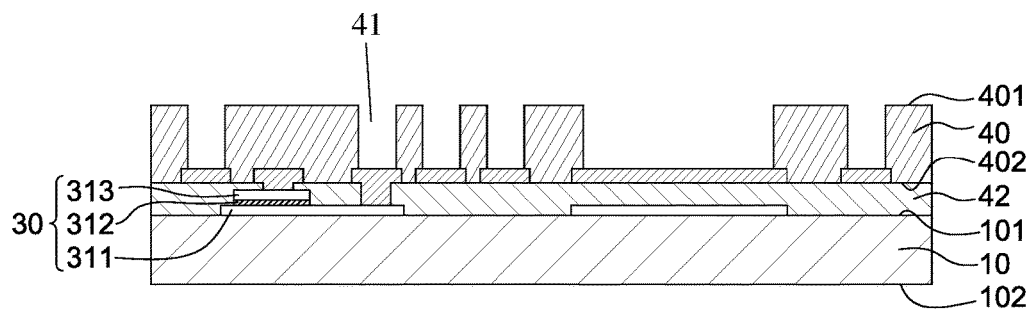
Figure 5C:
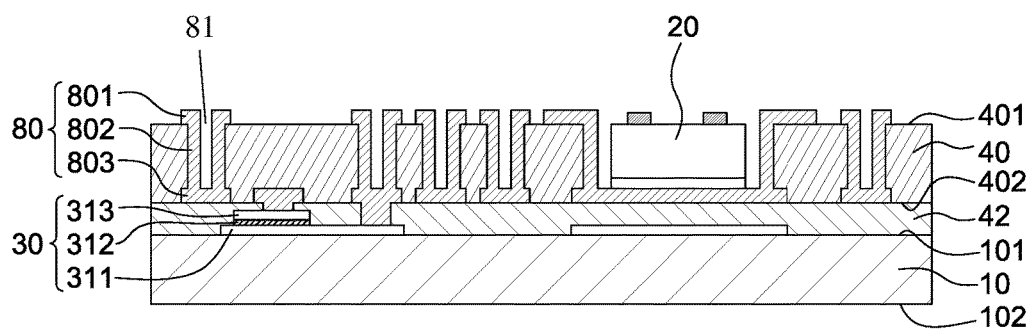

Referring to FIG. 5B, a patterned insulation layer 40 is disposed on the insulation layer 42. The patterned insulation layer 40 has a top surface 401 and vias 41. In some embodiments, the insulation layer 40 includes a suitable insulating material. For example, the insulation layer 40 may include, or may be formed from, an exposure-type negative photoresist. Referring to FIG. 5B and FIG. 5C, metal bars 803 are disposed on the bottom surface of the vias 41. Some of the metal bars 803 are connected to the patterned conductive layers 311 and 313.

Referring to FIG. 5C, interconnection structures 802 are disposed on the sidewall of the vias 41. Metal bars 801 are disposed on the surface 401 of the insulation layer 40. A semiconductor die 20 is attached to the metal bars 803 through a conductive adhesive layer. The metal bars 801, interconnection structures 802 and metal bars 803 together form the patterned conductive layers 80. The patterned conductive layers 80 also include vias 81.

Figure 5D:
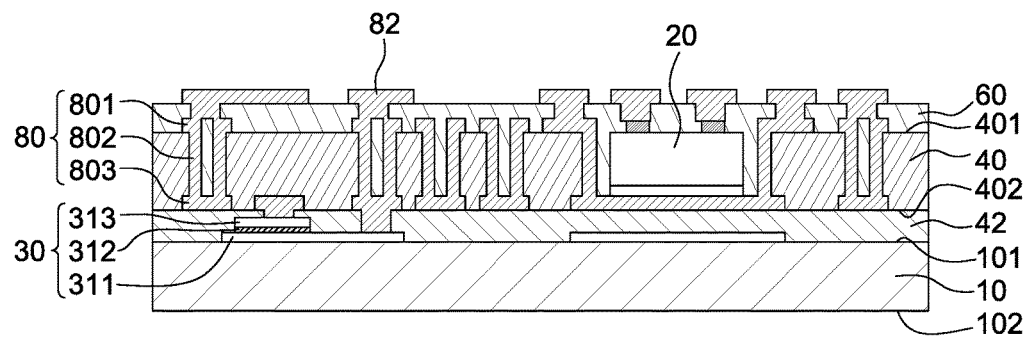
Figure 5E:
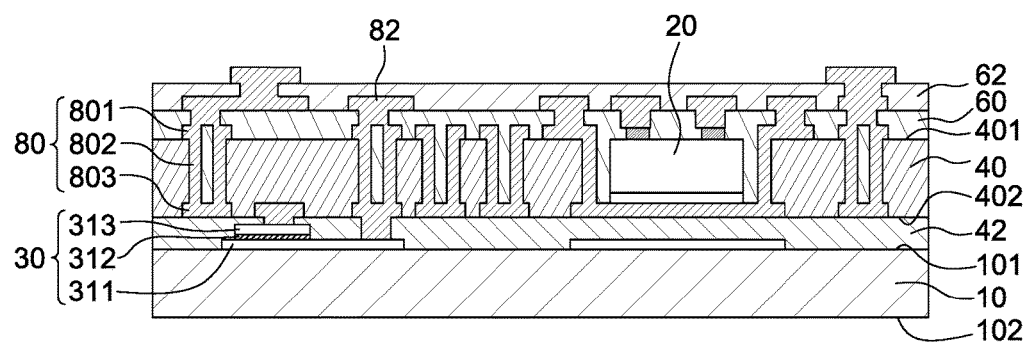

Referring to FIG. 5D, an insulation layer 60 is formed or disposed to cover the surface 401 of insulation layer 40. The insulation layer 60 also fills the vias 81. Next, the patterned conductive layers 82 are disposed on the surface 401 of insulation layer 40, the insulation layer 60 and the metal bars 801. Referring to FIG. 5E, an insulation layer 62 is disposed to cover the insulation layer 60 and the patterned conductive layers 82. The insulation layer 62 may be a solder mask layer. In some embodiments, the material of the insulation layer 62 may be an epoxy resin, exposure-type negative photoresist or other insulating materials used additionally or alternatively. Next, conductive connects 78 are formed or disposed on a conductive pad to obtain the semiconductor device package 2 of FIG. 2. The conductive connects 78 may be solder balls.

Figure 6A:
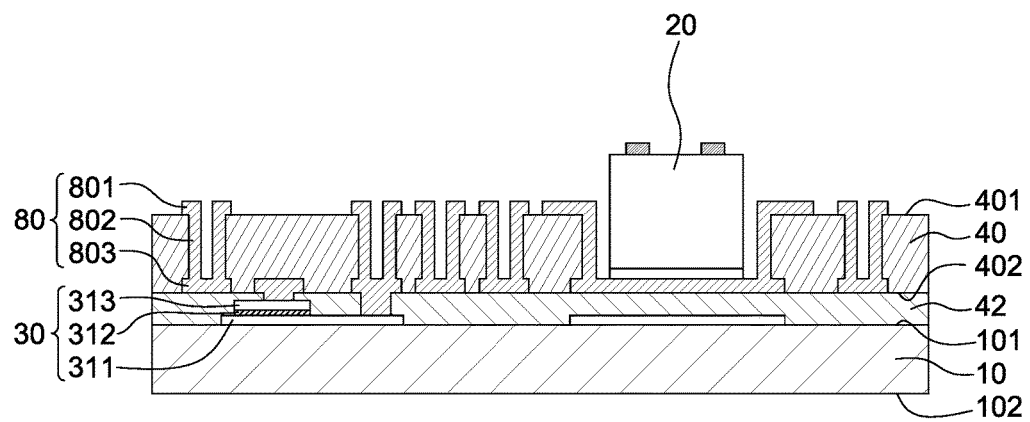
FIG. 6A, FIG. 6B, FIG. 6C, and FIG. 6D illustrate a method of manufacturing a semiconductor device package in accordance with some embodiments of the present disclosure.

FIG. 6A, FIG. 6B, FIG. 6C, and FIG. 6D illustrate a method of manufacturing a semiconductor device package in accordance with some embodiments. The manufacturing method shown in FIGS. 6A-6D is similar to the manufacturing methods shown in FIGS. 5A-5D, except that two layers of the insulation layer 40 are formed. Referring to FIG. 6A, a carrier 10 is provided. The carrier 10 has a top surface 101. The carrier 10 includes glass, silicon, $SiO_2$, or a combination thereof. A patterned conductive layer 311, an insulating layer 312 and a patterned conductive layer 313 are disposed on the surface 101 of the carrier 10. The patterned conductive layers 311 and 313, together with the insulating layer 312, form the capacitor 30. An insulation layer 42 is disposed on the carrier 10 and covers the capacitor 30. The insulation layer 42 includes vias. In some embodiments, the material of the insulation layer 42 may be an exposure-type negative photoresist; however, other suitable materials may be additionally or alternatively used.

Figure 6B:
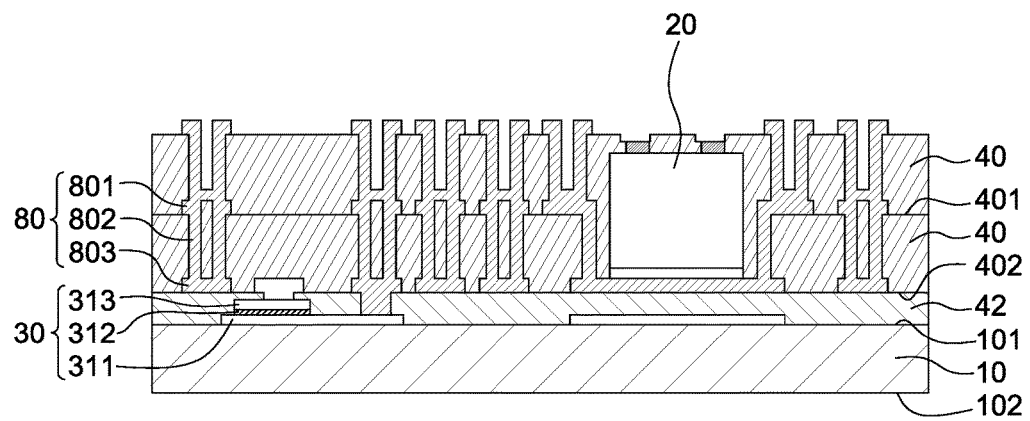

Referring to FIG. 6B, a first layer of a patterned insulation layer 40 is disposed on the insulation layer 42. The patterned insulation layer 40 has a top surface 401 and vias 41. In some embodiments, the insulation layer 40 includes a suitable insulating material. For example, the insulation layer 40 may include, or may be formed from, an exposure-type negative photoresist. Metal bars 803 are disposed on the bottom surface of the vias 41. Interconnection structures 802 are disposed on the sidewall of the vias 41. Metal bars 801 are disposed on the surface 401 of the insulation layer 40. A semiconductor die 20 is attached to the metal bars 803 through a conductive adhesive layer. The metal bars 801, interconnection structures 802 and metal bars 803 together form a first layer of the patterned conductive layers 80. Next, a second layer of a patterned insulation layer 40 is disposed on the first layer of a patterned insulation layer 40. A second layer of the patterned conductive layers 80 is formed in a similar way as the first layer of the patterned conductive layers 80.

Figure 6C:
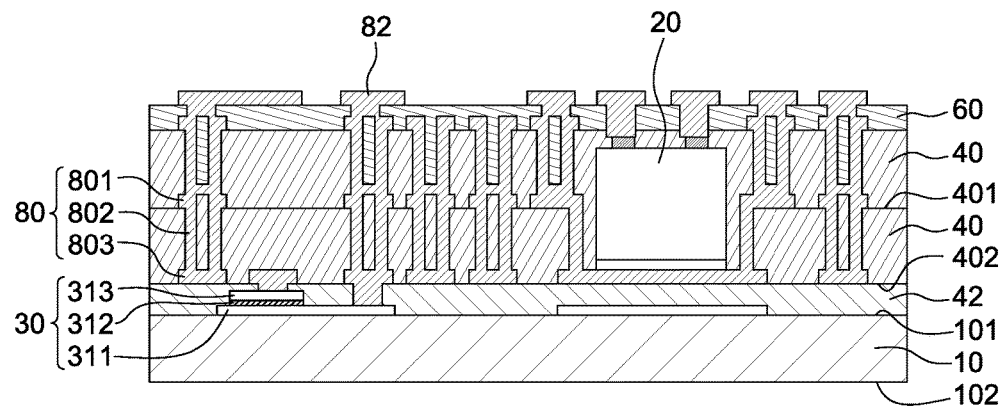

Referring to FIG. 6C, an insulation layer 60 is formed or disposed to cover the surface 401 of the second layer of the insulation layer 40. The insulation layer 60 also fills the vias 81 of the second layer of the patterned conductive layers 80. Next, the patterned conductive layers 82 are disposed on the surface 401 of the second layer of the insulation layer 40.

Figure 6D:
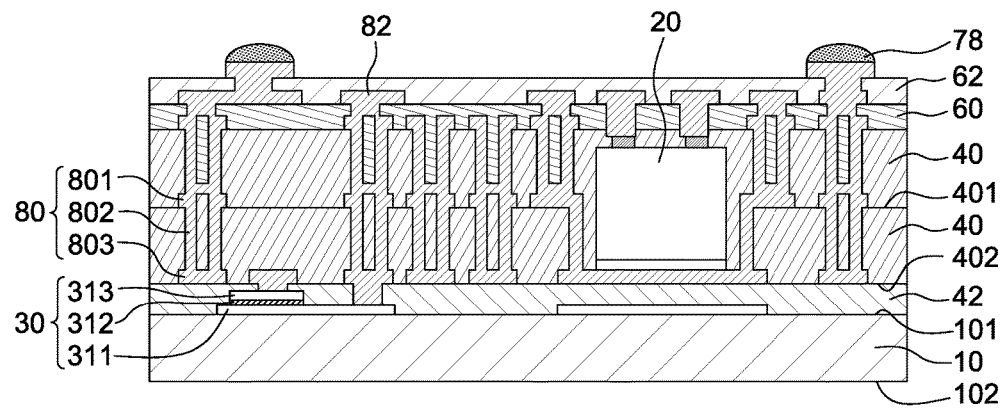

Referring to FIG. 6D, an insulation layer 62 is disposed to cover the insulation layer 60 and the patterned conductive layers 82. The insulation layer 62 may be a solder mask layer. In some embodiments, the material of the insulation layer 62 may be an epoxy resin, exposure-type negative photoresist or other insulating materials used additionally or alternatively. Next, conductive connects 78 is formed or disposed on a conductive pad to obtain the semiconductor device of FIG. 6D. The conductive connects 78 may be solder balls.

Figures 7A, 7B:
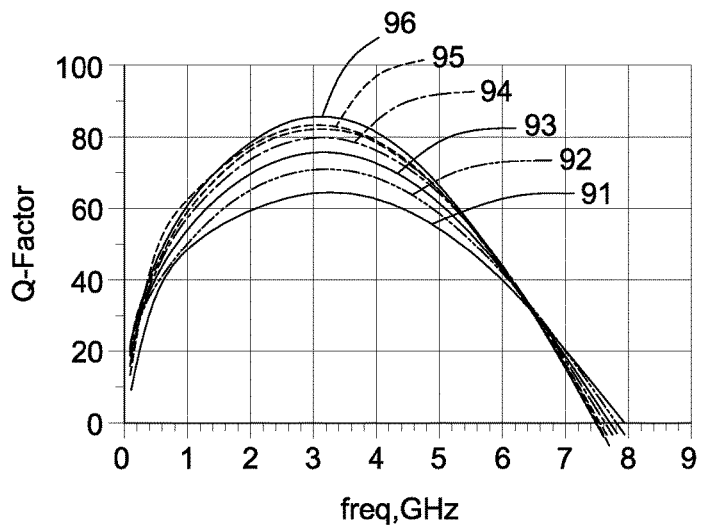
FIG. 7A and FIG. 7B illustrate simulation results in accordance with some embodiments of the present disclosure.

FIG. 7A illustrates a simulation diagram of Q-factors for 2D inductors and a U-sharp inductor in accordance with some embodiments. A curve 96 represents a Q-factor of a 2D inductor design including a metal structure of 60 μm. A curve 95 represents a Q-factor of a U-sharp inductor design including a metal structure of 50 μm. A curve 94 represents a Q-factor of a 2D inductor design including a metal structure of 40 μm. A curve 93 represents a Q-factor of a 2D inductor design including a metal structure of 30 μm. A curve 92 represents a Q-factor of a 2D inductor design including a metal structure of 20 μm. A curve 91 represents a Q-factor of a 2D inductor design including a metal structure of 10 µm. As shown in FIG. 7A, the Q-factor of the U-sharp inductor of 50 µm is higher at 2.4 Gigahertz (GHz).

FIG. 7B illustrates simulation results of a Q-factor of 2D inductors and a U-sharp inductor in accordance with some embodiments. The Q-factor of a U-sharp inductor having a metal thickness of 10 µm is 81 at 2.4 GHz. A 2D inductor having a metal thickness of 50 µm is 80 at 2.4 GHz. A U-sharp inductor has better performance of the Q-factor with a metal thickness of 10 as compared to the 2D inductor design.

Figure 8A:
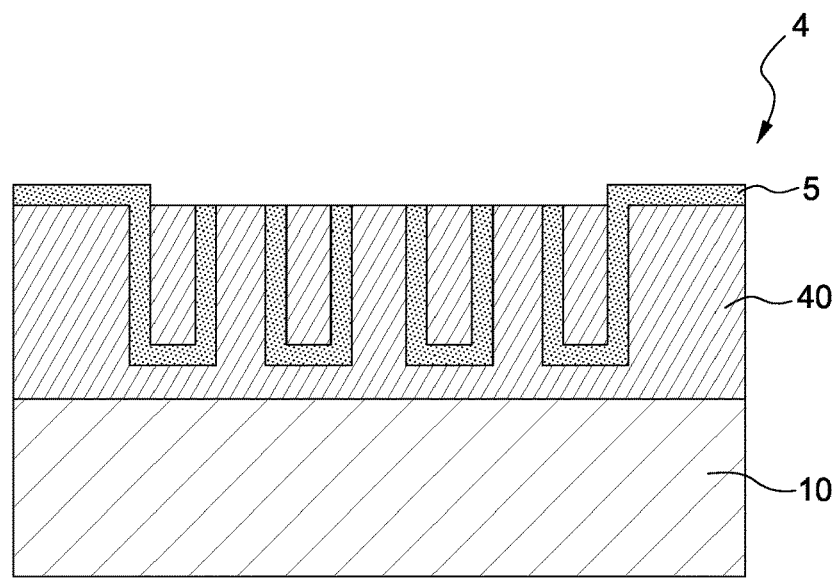
FIG. 8A and FIG. 8B illustrate a cross-sectional view of current flow in accordance with some embodiments.
Figure 8B:
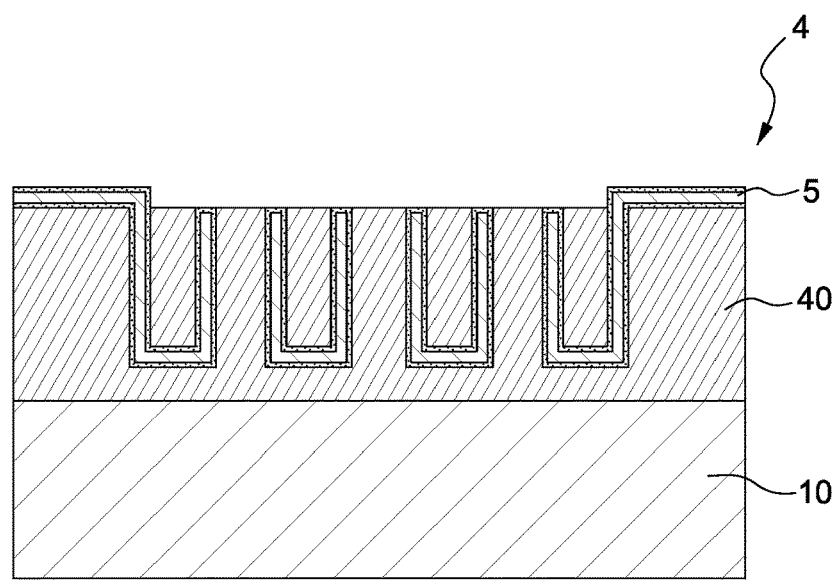

FIG. 8A and FIG. 8B illustrate cross-sectional views of the current flow of a U-sharp inductor 4. In FIG. 8A, the current density will be evenly distributed within a metal structure 5. In FIG. 8B, the current density will be distributed merely on the surface of the metal structure 5 at high frequency. The current density is largest near the surface of the metal structure 5. The current density will decrease with greater depths in the metal structure 5 (e.g., Skin effect) at high frequency.

FIG. 9 provides simulation results in accordance with some embodiments of the present disclosure. As shown in FIG. 9, the skin depth of current density decreases when the frequency is increasing. The skin depth is about 0.9 µm at a frequency of 5 GHz.

As used herein, the terms "approximately," "substantially," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For another example, a first angle may be approximately the same as a second angle if a difference between the first angle and the second angle is less than or equal to ±10°, such as ±5°, ±4°, ±3°, ±2°, ±1°, ±0.5°, ±0.1°, or ±0.05°. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
    a carrier;
    a first insulation layer disposed on the carrier and having a first surface and a second surface adjacent to the carrier and opposite to the first surface, the first insulation layer defining a plurality of through holes;
    a second insulation layer disposed on the first surface of the first insulation layer and including portions extending into the first insulation layer;
    a capacitor element disposed in the first insulation layer, the capacitor element including a top electrode and a bottom electrode;
    a plurality of interconnection structures disposed within the through holes and formed as conductive vias;
    a plurality of substantially parallel top-side metal bars disposed on the first surface of the first insulation layer; and
    a plurality of substantially parallel bottom-side metal bars disposed on the second surface of the first insulation layer,
    wherein each of the conductive vias couples one of the plurality of top-side metal bars to one of the plurality of bottom-side metal bars,
    wherein a first one of the plurality of bottom-side metal bars is electrically connected to the top electrode of the capacitor element and a second one of the plurality of bottom-side metal bars is electrically connected to the bottom electrode of the capacitor element, and
    wherein the plurality of interconnection structures respectively surround the portions of the second insulation layer extending into the first insulation layer.

2. The semiconductor device package of claim 1, wherein at least one of the top-side metal bars, at least one of the interconnection structures and at least one of the bottom-side metal bars function as an inductor.

3. The semiconductor device package of claim 1, wherein a thickness of the interconnection structures is less than about 10 micrometers (μm) and a thickness of at least one of the top-side metal bars and at least one of the bottom-side metal bars is less than about 10 μm.

4. The semiconductor device package of claim 1, further comprising a third insulation layer disposed between the first insulation layer and the carrier.

5. The semiconductor device package of claim 4, wherein the first insulation layer includes a first insulation material and the third insulation layer includes a third insulation material different from the first insulation material.

6. The semiconductor device package of claim 1, wherein the first insulation layer includes a first insulation material and the second insulation layer includes a second insulation material different from the first insulation material.

7. The semiconductor device package of claim 1, wherein each of the top-side metal bars, the interconnection structures and the bottom-side metal bars comprises a seed layer and a plating layer.

8. The semiconductor device package of claim 7, wherein a material of the seed layer is different from a material of the plating layer.

9. The semiconductor device package of claim 1, wherein the carrier includes a glass carrier and a surface roughness of the glass carrier is less than about 1 μm.

10. The semiconductor device package of claim 1, wherein the interconnection structures function as a shielding element.

11. The semiconductor device package of claim 1, wherein the first insulation layer is formed from an exposure-type negative photoresist.

12. A semiconductor device package, comprising:
a carrier;
a first insulation layer disposed on the carrier and having a first surface and a second surface adjacent to the carrier and opposite to the first surface, the first insulation layer defining a plurality of through holes, each of the through holes having a first side wall, and the first insulation layer defining a cavity having a second side wall;
a capacitor element in the first insulation layer, the capacitor element including a top electrode and a bottom electrode;
a die disposed in the cavity of the first insulation layer; and
a conductive layer including a plurality of interconnection structures respectively disposed on the first side wall and the second side wall and including a plurality of top continuous portions and a plurality of bottom continuous portions,
wherein the interconnection structures, the top continuous portions and the bottom continuous portions of the conductive layer form an inductor element, and
wherein a first one of the bottom continuous portions of the conductive layer is electrically connected to the top electrode of the capacitor element and a second one of the bottom continuous portions of the conductive layer is electrically connected to the bottom electrode of the capacitor element.

13. The semiconductor device package of claim 12, wherein a thickness of the interconnection structures is less than about 10 μm.

14. The semiconductor device package of claim 12, further comprising a second insulation layer disposed between the first insulation layer and the carrier.

15. The semiconductor device package of claim 14, wherein the first insulation layer includes a first insulation material and the second insulation layer includes a second insulation material different from the first insulation material.

16. The semiconductor device package of claim 12, wherein the carrier includes a glass carrier and a surface roughness of the glass carrier is less than about 1 μm.

17. The semiconductor device package of claim 12, wherein the first insulation layer is formed from an exposure-type negative photoresist.

* * * * *